United States Patent
Keller et al.

(10) Patent No.: US 11,022,640 B2
(45) Date of Patent: Jun. 1, 2021

(54) SINGLE PHASE FAULT ISOLATION AND RESTORATION FOR LOSS OF VOLTAGE FAULT IN POWER DISTRIBUTION NETWORK

(71) Applicant: G & W ELECTRIC COMPANY, Bolingbrook, IL (US)

(72) Inventors: Erich Keller, Naperville, IL (US); Nicholas Carmine DiFonzo, Des Plaines, IL (US)

(73) Assignee: G & W ELECTRIC COMPANY, Bolingbrook, IL (US)

( * ) Notice: Subject to any disclaimer, the term of this patent is extended or adjusted under 35 U.S.C. 154(b) by 0 days.

(21) Appl. No.: 17/071,853

(22) Filed: Oct. 15, 2020

(65) Prior Publication Data
US 2021/0102987 A1 Apr. 8, 2021

Related U.S. Application Data

(63) Continuation of application No. 16/595,272, filed on Oct. 7, 2019.

(51) Int. Cl.
*G01R 31/08* (2020.01)
*G05B 15/02* (2006.01)

(52) U.S. Cl.
CPC ........... *G01R 31/086* (2013.01); *G05B 15/02* (2013.01)

(58) Field of Classification Search
None
See application file for complete search history.

(56) References Cited

U.S. PATENT DOCUMENTS

| 7,154,722 B1 | 12/2006 | Stoupis et al. |
| 2009/0112375 A1 | 4/2009 | Popescu |
| (Continued) | | |

FOREIGN PATENT DOCUMENTS

| CN | 107947134 A | 4/2018 |
| CN | 109494696 A | 3/2019 |
| CN | 108376974 B | 9/2019 |

OTHER PUBLICATIONS

G&W Electric Company, Lazer Automation: Catalog, Mar. 2012 (8 Pages).

(Continued)

*Primary Examiner* — Evren Seven
(74) *Attorney, Agent, or Firm* — Michael Best & Friedrich LLP

(57) ABSTRACT

A system for controlling a power distribution network providing power using a plurality of phases comprises an electronic processor and memory storing instructions that, when executed by the electronic processor, cause the system to receive a loss of voltage fault indication associated with a fault in the power distribution network. The electronic processor identifies a first subset of the plurality of phases associated with the loss of voltage fault indication and a second subset of the plurality of phases not associated with the loss of voltage fault indication. The first and second subsets each include at least one member. The electronic processor identifies a downstream isolation device downstream of the fault. The electronic processor sends an open command to the downstream isolation device for each phase in the first subset. The electronic processor sends a close command to a tie-in isolation device downstream of the downstream isolation device.

20 Claims, 10 Drawing Sheets

(56) References Cited

U.S. PATENT DOCUMENTS

| | | | |
|---|---|---|---|
| 2011/0029148 A1* | 2/2011 | Yang | H02H 7/28 |
| | | | 700/297 |
| 2012/0155557 A1 | 6/2012 | Bush et al. | |
| 2013/0063273 A1* | 3/2013 | Bhageria | G06N 5/04 |
| | | | 340/653 |
| 2013/0070378 A1 | 3/2013 | Witte | |
| 2013/0325402 A1* | 12/2013 | Vukojevic | H02J 13/00034 |
| | | | 702/181 |
| 2018/0233895 A1* | 8/2018 | O'Regan | H02J 13/0004 |
| 2019/0245342 A1* | 8/2019 | Sharon | H02H 7/26 |
| 2019/0280476 A1 | 9/2019 | Fan et al. | |
| 2020/0072894 A1* | 3/2020 | Montenegro | G01R 19/2513 |
| 2020/0191841 A1* | 6/2020 | Lakirovich | G01R 19/0092 |
| 2020/0195007 A1 | 6/2020 | Sun et al. | |
| 2020/0309841 A1* | 10/2020 | Sharon | G01R 31/085 |

OTHER PUBLICATIONS

G&W Electric Company, Lazer Automation: Lazer I Automation Solutions brochure, Apr. 2012 (4 Pages).

G&W Electric Company, Lazer Automation: Fault Detection, Isolation, Reconfiguration and Loss of Voltage Proposal brochure, Midwest Energy Michigan, Aug. 15, 2013 (37 Pages).

G&W Electric Company, Lazer Automation: Loop Automation Schemes brochure, available at least as early as Jan. 21, 2015 (3 Pages).

G&W Electric Company, Lazer II Restoration Automation brochure, available at least as early as Jan. 21, 2015 (1 Page).

U.S. Appl. No. 17/071,852 dated Nov. 10, 2020 (13 pages).

European Patent Office Extended Search Report for Application No. 20200402.4 dated Feb. 26, 2021 (7 pages).

Le et al., "Flisr Approach for Smart Distribution Networks Using E-Terra Software—A Case Study," Energies, Nov. 2018, 11(12):3333.

* cited by examiner

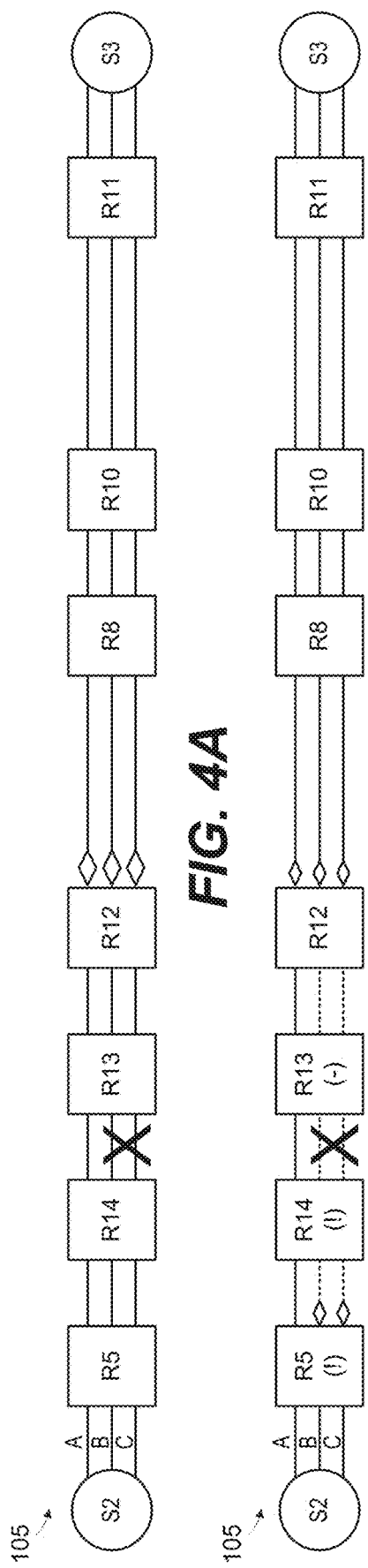

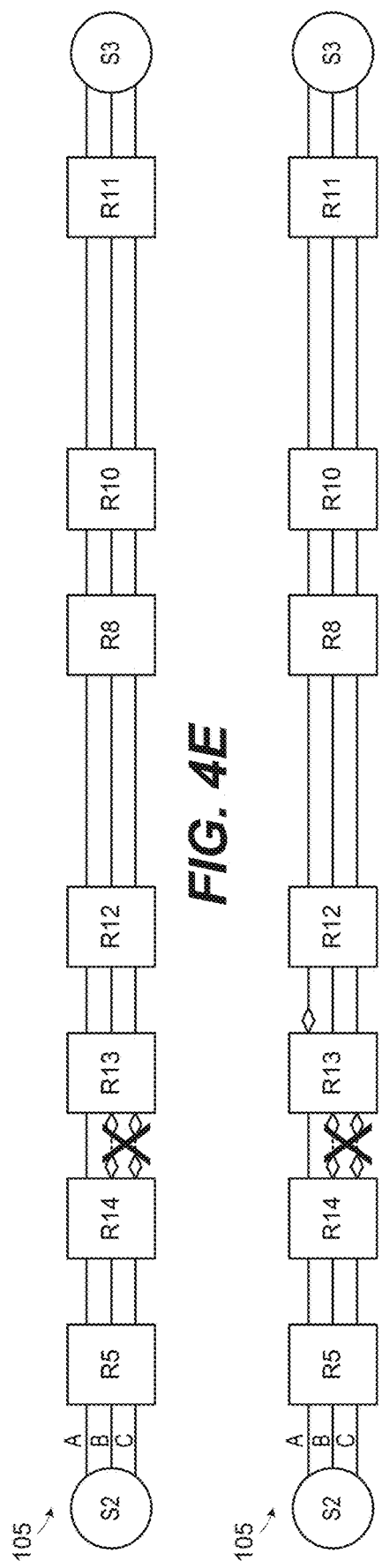

SINGLE PHASE FAULT ISOLATION AND RESTORATION FOR LOSS OF VOLTAGE FAULT IN POWER DISTRIBUTION NETWORK

CROSS-REFERENCE TO RELATED APPLICATIONS

This application is a continuation of U.S. patent application Ser. No. 16/595,272, filed Oct. 7, 2019, the entire contents of both of which are incorporated by reference herein.

FIELD OF DISCLOSURE

Embodiments described herein relate to power distribution networks. More particularly, embodiments described herein relate to systems and methods for providing single phase fault isolation and restoration for a loss of voltage fault in a power distribution network.

SUMMARY

Power distribution networks include fault monitoring equipment that identifies problems in the system and opens isolation devices to isolate the problems. Example problems with the distribution system include overcurrent faults, phase-to-phase faults, ground faults, etc. that may arise from various causes, such as equipment failure, weather-related damage to equipment, etc. Switching equipment is provided in the power distribution network to isolate the detected faults. In some instances, a fault may be detected by an isolation device that is not located closest to the fault. As a result, power may be interrupted for more customers than necessary. Various isolation devices attempt to reclose to restore power to non-affected portions of the power distribution network. Power distribution networks typically use three-phase transmission lines, and the isolation devices are controlled to isolate all three phases in response to a detected fault. Even in cases where a particular fault only involves one or two of the phases, power is interrupted for all customers on the affected transmission line.

In particular, embodiments described herein provide systems and methods for providing single phase fault isolation and restoration in a power distribution network.

In one embodiment, a system for controlling a power distribution network providing power using a plurality of phases comprises an electronic processor and memory storing instructions that, when executed by the electronic processor, cause the system to receive a loss of voltage fault indication associated with a fault in the power distribution network. The electronic processor identifies a first subset of the plurality of phases associated with the loss of voltage fault indication and a second subset of the plurality of phases not associated with the loss of voltage fault indication. The first and second subsets each include at least one member. The electronic processor identifies a downstream isolation device downstream of the fault. The electronic processor sends an open command to the downstream isolation device for each phase in the first subset. The electronic processor sends a close command to a tie-in isolation device downstream of the downstream isolation device.

In another embodiment, a method for controlling a power distribution network providing power using a plurality of phases includes receiving, by an electronic processor, a loss of voltage fault indication associated with a fault in the power distribution network. A first subset of the plurality of phases associated with the loss of voltage fault indication and a second subset of the plurality of phases not associated with the loss of voltage fault indication are identified by the electronic processor. The first and second subsets each include at least one member. A downstream isolation device downstream of the fault is identified by the electronic processor. An open command is sent by the electronic processor to the downstream isolation device for each phase in the first subset. A close command is sent by the electronic processor to a tie-in isolation device downstream of the downstream isolation device.

Other aspects of the disclosure will become apparent by consideration of the detailed description and accompanying drawings.

BRIEF DESCRIPTION OF THE DRAWINGS

FIGS. 4A-4F are diagrams illustrating the operation of the system of FIG. 1 for a fault, according to some embodiments.

DETAILED DESCRIPTION

One or more embodiments are described and illustrated in the following description and accompanying drawings. These embodiments are not limited to the specific details provided herein and may be modified in various ways. Furthermore, other embodiments may exist that are not described herein. Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way, but may also be configured in ways that are not listed. Furthermore, some embodiments described herein may include one or more electronic processors configured to perform the described functionality by executing instructions stored in non-transitory, computer-readable medium. Similarly, embodiments described herein may be implemented as non-transitory, computer-readable medium storing instructions executable by one or more electronic processors to perform the described functionality. As used herein, "non-transitory computer-readable medium" comprises all computer-readable media but does not consist of a transitory, propagating signal. Accordingly, non-transitory computer-readable medium may include, for example, a hard disk, a CD-ROM, an optical storage device, a magnetic storage device, a ROM (Read Only Memory), a RAM (Random Access Memory), register memory, a processor cache, or any combination thereof.

Also, the phraseology and terminology used herein is for the purpose of description and should not be regarded as limiting. For example, the use of "including," "containing," "comprising," "having," and variations thereof herein is meant to encompass the items listed thereafter and equivalents thereof as well as additional items. The terms "connected" and "coupled" are used broadly and encompass both direct and indirect connecting and coupling. Further, "connected" and "coupled" are not restricted to physical or mechanical connections or couplings and can include electrical connections or couplings, whether direct or indirect. In addition, electronic communications and notifications may be performed using wired connections, wireless connections, or a combination thereof and may be transmitted directly or through one or more intermediary devices over various types of networks, communication channels, and connections. Moreover, relational terms such as first and second, top and bottom, and the like may be used herein solely to distinguish one entity or action from another entity or action without necessarily requiring or implying any actual such relationship or order between such entities or actions.

Figure 1:
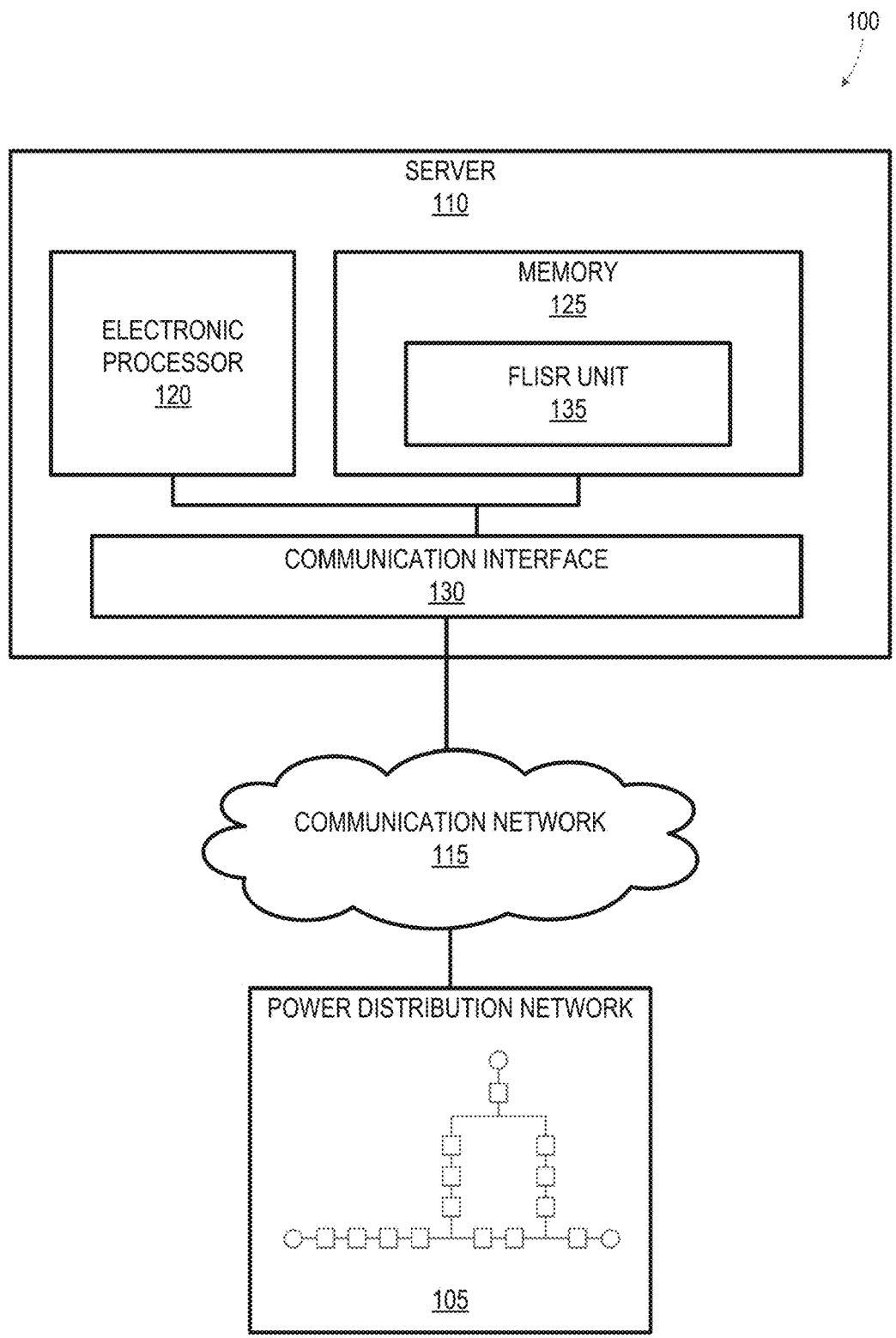
FIG. 1 is a simplified block diagram of a system for controlling single phase fault isolation in a power distribution network, according to some embodiments.

FIG. 1 illustrates a system 100 for controlling a power distribution network 105, according to some embodiments. In the example shown, the system 100 includes a server 110 communicating with entities in the power distribution network 105 over one or more communication networks 115. In some embodiments, the system 100 includes fewer, additional, or different components than illustrated in FIG. 1. For example, the system 100 may include multiple servers 110. The communication network 115 employs one or more wired or wireless communication entities. Portions of the communication network 115 may be implemented using a wide area network, such as the Internet, a local area network, such as a Bluetooth™ network or Wi-Fi, and combinations or derivatives thereof. In some embodiments, components of the system 100 communicate through one or more intermediary devices not illustrated in FIG. 1.

The server 110 is a computing device that may serve as a centralized resource for controlling entities in the power distribution network 105. As illustrated in FIG. 1, the server 110 includes an electronic processor 120, a memory 125, and a communication interface 130. The electronic processor 120, the memory 125 and the communication interface 130 communicate wirelessly, over one or more communication lines or buses, or a combination thereof. The server 110 may include additional components than those illustrated in FIG. 1 in various configurations. The server 110 may also perform additional functionality other than the functionality described herein. Also, the functionality described herein as being performed by the server 110 may be distributed among multiple devices, such as multiple servers included in a cloud service environment.

The electronic processor 120 includes a microprocessor, an application-specific integrated circuit (ASIC), or another suitable electronic device for processing data. The memory 125 includes a non-transitory computer-readable medium, such as read-only memory (ROM), random access memory (RAM) (for example, dynamic RAM (DRAM), synchronous DRAM (SDRAM), and the like), electrically erasable programmable read-only memory (EEPROM), flash memory, a hard disk, a secure digital (SD) card, another suitable memory device, or a combination thereof. The electronic processor 120 is configured to access and execute computer-readable instructions ("software") stored in the memory 125. The software may include firmware, one or more applications, program data, filters, rules, one or more program modules, and other executable instructions. For example, the software may include instructions and associated data for performing a set of functions, including the methods described herein. For example, as illustrated in FIG. 1, the memory 125 may store instructions for executing a fault location, isolation, and restoration (FLISR) unit 135 to control entities in the power distribution network 105.

The communication interface 130 allows the server 110 to communicate with devices external to the server 110. For example, as illustrated in FIG. 1, the server 110 may communicate with entities in the power distribution network 105. The communication interface 130 may include a port for receiving a wired connection to an external device (for example, a universal serial bus (USB) cable and the like), a transceiver for establishing a wireless connection to an external device (for example, over one or more communication networks 115, such as the Internet, local area network (LAN), a wide area network (WAN), and the like), or a combination thereof.

Figure 2:
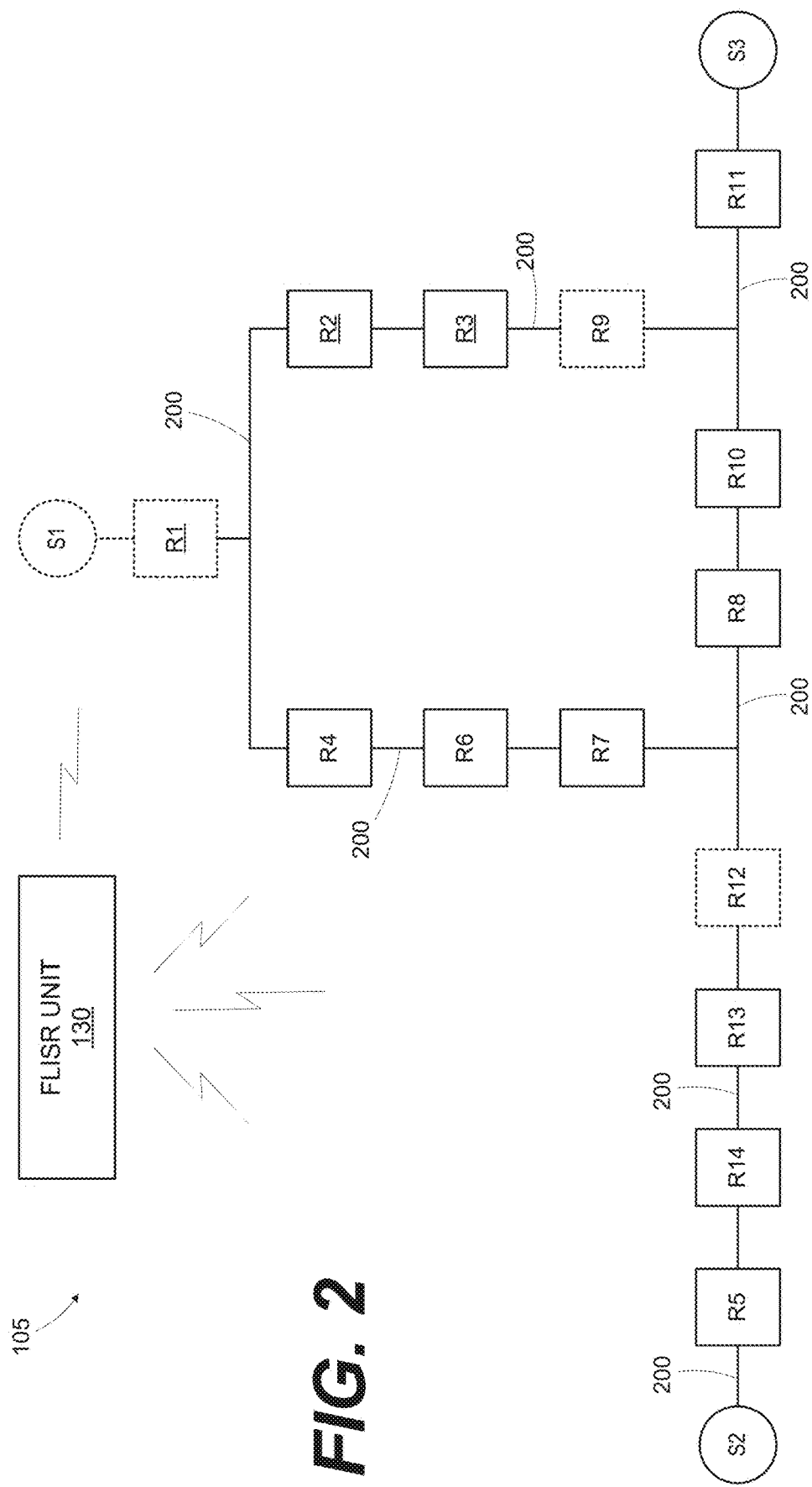
FIG. 2 is a simplified diagram of a power distribution network, according to some embodiments.

FIG. 2 is a simplified diagram of the power distribution network 105, according to some embodiments. In the example shown, the power distribution network 105 comprises sources, S1-S3, and isolation devices R1-R14. The sources S1-S3 and isolation devices R1-R14 are connected by transmission lines 200. In general, the isolation devices R1-R14 serve to segment the power distribution network 105 such that power is provided via a single source S1-S3 and to isolate portions of the power distribution network 105 in response to identified faults. The isolation devices R1-R14 may also be referred to as reclosers. Open transmission lines 200 are illustrated with dashed lines, where an open diamond is adjacent the isolation device 305 isolating the transmission line 200 from a power source. In general, only one source S1-S3 feeds a section of the power distribution network 105. Certain isolation devices R1-R14 are designated as tie-in devices that allow a different source S1-S3 to be tied in to a section normally fed by a different source S1-S3. For example, the source S2 feeds the transmission lines 200 associated with the isolation devices R5, R14, R13, R12. The isolation device R12 is in an open state, and is a tie-in device that may be closed to provide power from one of the other sources S1, S3. Similarly, isolation devices R7, R9 are tie-in devices associated with the source S1. FIG. 2 illustrates the normal operating configuration of the power distribution network 105 with no faults.

Figure 3:
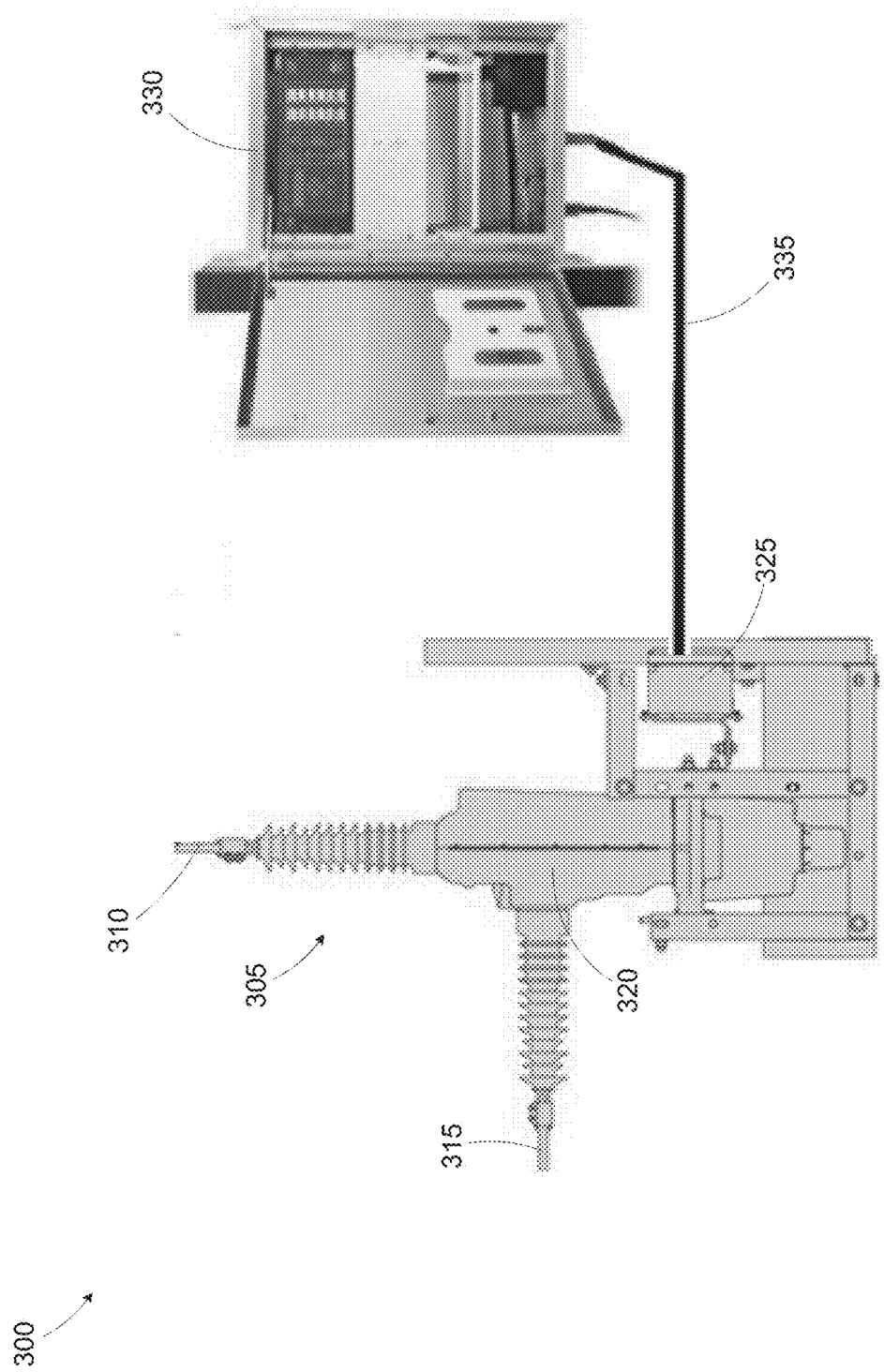
FIG. 3 is a diagram of a switchgear system including an isolation device, according to some embodiments.

FIG. 3 is a diagram of a switchgear system 300 including an isolation device 305, according to some embodiments. The isolation device 305 may also be referred to as a recloser and corresponds to one of the isolation devices R1-R14 in FIG. 2. In the example provided in FIG. 3, the isolation device 305 receives high voltage electrical power via a line connection 310, and delivers the high voltage electrical power via a load connection 315. An interrupting medium 320 (for example, a vacuum interrupter) is electrically coupled between the line connection 310 and the load connection 315 to selectively interrupt current flow therebetween. The switchgear system 300 also includes a junction board 325 that is electrically coupled to the isolation device 305. A controller 330 is electrically coupled to the junction board 325 via a control cable 335. In FIG. 3, only one phase of the isolation device 305 is illustrated. For ease of description, the other two phases of the three phase isolation device 305 are not shown or described in detail. However, the other two phases of the three phase isolation device 305 may include similar components as shown in FIG. 3. For example, each of the other two phases may include an interrupting medium, line and load connections, and a junction board. The controller 330 may be connected to control all of the junction boards 325.

The isolation device 305 automatically tests the electrical line to identify a fault condition, and automatically opens the line if a fault is detected. In some embodiments, the isolation device 305 opens all three phases in response to detecting a fault, such as an overcurrent fault. The isolation device 305 may operate in a recloser mode or a one shot mode.

In the recloser mode, the isolation device 305 determines whether the fault condition was only temporary and has resolved and automatically resets to close the line and restore electric power. Many trouble conditions on high voltage lines are temporary (e.g., lightning, windblown tree branches, windblown transmission lines, animals, etc.), and will, by their very nature, remove themselves from the transmission line if the power is shut off before permanent damage occurs. The isolation device 305 senses when trouble occurs and automatically opens to remove power. After a short time delay, which may be recognized as a lightbulb flicker, for example, the isolation device 305 recloses to restore power. However, if the trouble condition is still present, the isolation device 305 will open again. If the trouble condition persists for a predetermined number of times (e.g., three), the isolation device 305 locks opens and sends a fault notification via the controller 330 to a centralized controller, such as the FLISR unit 135 executing on the server 110 of FIG. 1. Examples of permanent problem conditions include damaged or down transmission lines, equipment failure, equipment damage caused by lightning strikes, fallen tree limbs, or vehicle crashes, etc.

In the one shot mode, the automatic recloser functionality of the isolation device 305 is disabled. If a fault condition is identified, the isolation device 305 locks open and sends a fault indication via the controller 330 without attempting to reclose.

Figure 5:
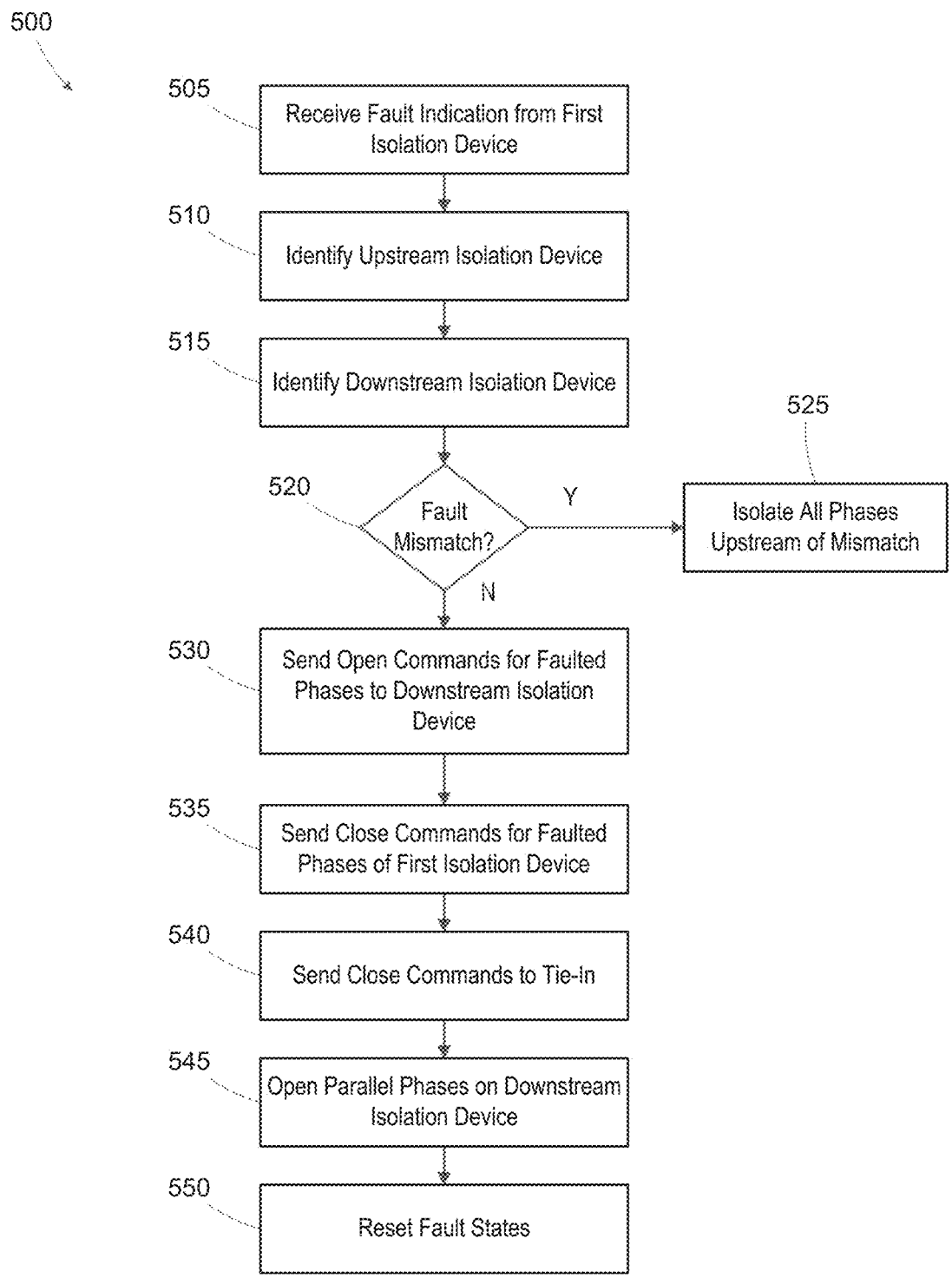
FIG. 5 is a flowchart of a method for operating the system of FIG. 1 for a fault, according to some embodiments.

Referring to FIGS. 4A-4F and FIG. 5, the operation of the system of FIG. 1 is illustrated for a fault. FIGS. 4A-4F are diagrams illustrating the operation of the system of FIG. 1 for a fault in a portion of the power distribution network 105 of FIG. 2, according to some embodiments. FIG. 5 is a flowchart of a method 500 for operating of the system of FIG. 1 for a fault, according to some embodiments.

In some embodiments, a lockout fault is a fault condition that causes the isolation device 305 identifying the condition to lock in an open state. Example lockout fault conditions include voltage faults, phase to phase faults, ground faults, etc. In some embodiments, the isolation device 305 signals a fault indication to the FLISR unit 135 of FIG. 1 after attempting to reclose a predetermined number of times, as described above.

In some instances, the isolation device 305 that opens or trips is not the isolation device 305 closest to the fault. For example, the communication links between the isolation devices 305 and the FLISR unit 135 may have different latencies. For purposes of the following example, assume that a phase to phase fault is present between the R14 isolation device 305 and the R13 isolation device 305. FIG. 4A illustrates the power distribution network 105 prior to any automatic operations, with the fault illustrated between the R14 and R13 isolation devices 305.

In response to the fault, the R5 isolation device 305 locks open and sends a fault indication (i.e., as indicated by the "!" in the R5 block). Referring to FIG. 5, a fault indication is received in the FLISR unit 135 (block 505), for example, from the R5 isolation device 305. In some embodiments, the FLISR unit 135 waits for a predetermined time interval (e.g., XX seconds) after receiving the fault indication before proceeding with restoration operations. As shown in FIG. 4B, the R5 isolation device 305 is locked open for a first subset of the phases that includes the faulted phases, B and C. A second subset of the phases includes the non-faulted phase, A.

After receiving fault indication (block 505), the FLISR unit 135 attempts to identify the fault location by examining the fault states of other isolation devices downstream of the fault issuing R5 isolation device 305. Isolation devices 305 with asserted faults states are identified with "!" indicators, and isolation devices 305 with clear fault states are identified with "-" indicators in FIG. 4B. In some embodiments, the isolation devices 305 send fault states at periodic time intervals, immediately in response to certain events, or in response to a refresh query from the FLISR unit 135.

As shown in block 510, the FLISR unit 135 identifies an upstream isolation device 305 representing the isolation device 305 immediately upstream of the fault, and as shown in block 515, the FLISR unit 135 identifies a downstream isolation device 305 representing the isolation device 305 immediately downstream of the fault. In the example of FIG. 4B, the R14 isolation device 305 is the upstream isolation device 305, and the R13 isolation device 305 is the downstream isolation device 305. In general, the isolation devices 305 downstream of the R5 isolation device 305, but before the fault, should have the same fault state as the R5 isolation device 305. The isolation device 305 immediately downstream of the fault should have a fault state that is clear since the fault does not affect the transmission lines associated with that isolation device 305. In some embodiments, the isolation device 305 that locks out and generates the fault indication is also the downstream isolation device 305. The FLISR unit 135 identifies the isolation device 305 furthest downstream in a string of isolation devices 305 having a fault state that matches the fault state of the triggering R5 isolation device 305 as the upstream isolation device (i.e., the R14 isolation device 305) (block 510). The FLISR unit 135 identifies the isolation device 305 downstream of the R14 upstream isolation device 305 having a fault state that does not register the fault seen by the triggering R5 isolation device as the downstream isolation device 305 (i.e., the R13 isolation device 305).

As shown in block 520, the FLISR unit 135 identifies a fault mismatch. A fault mismatch is registered in response to an isolation device 305 downstream of the triggering R5 isolation device 305 having a fault state that registers a different fault condition than the fault state of the triggering isolation device 305. For example, a mismatch may be identified in an example where the triggering isolation device 305 registers a phase to phase fault affecting phases B and C, and one of the downstream isolation devices 305 registers a fault with phase A. Although block 520 is illustrated as being performed after block 515, the mismatch condition is actually identified concurrently with the identification of the upstream isolation device 305 (block 510) and the identification of the downstream isolation device 305 (block 515). If a fault mismatch is identified (block 520), the FLISR unit 135 opens all phases of the isolation device 305 prior to the fault mismatch as shown in block 525 and proceeds with three phase restoration. If a fault mismatch is not identified (block 520), the FLISR unit 135 proceeds with single phase restoration operations.

As shown in block 530, the FLISR unit 135 sends open commands for the faulted phases in the first subset to the R13 downstream isolation device 305, as illustrated in FIG.

4C. In some embodiments, the FLISR unit 135 also sends open commands to the R14 upstream isolation device 305 prior to opening the R13 downstream isolation device 305. In an instance where the isolation device 305 identifying the fault condition is also the upstream isolation device 305 (i.e., closest to the fault), the isolation device 305 identifying the fault condition is already open for the faulted states, and an open command need not be sent to the upstream isolation device 305.

As shown in block 535, the FLISR unit 135 sends close commands for the faulted phases in the first subset to the R5 isolation device 305 that triggered the fault condition. In an instance where the isolation device 305 identifying the fault condition is also the upstream isolation device 305 (i.e., closest to the fault), close commands need not be sent to the upstream isolation device 305. Closing the non-faulted phases restores power to customers up to the R14 upstream isolation device 305. In some embodiments, when there are multiple non-faulted phases, the FLISR unit 135 closes the non-faulted phases individually using sequential close commands.

As shown in block 540, the FLISR unit 135 sends close commands for a tie-in isolation device 305, as illustrated in FIG. 4E. For example, the R12 isolation device 305 is downstream of the fault and the R13 downstream isolation device 305 and can provide power from the source S3. In some embodiments, the FLISR unit 135 sends a ganged close command to the R12 tie-in device 305. In some embodiments, the FLISR unit 135 sends mode messages to the R5, R14, R13, R12, R8, R10, R11 isolation devices 305 on the parallel phases to the alternate source S3 placing them in one shot mode prior to sending the close commands. Thus, if one of the isolation devices 305 on the parallel phases trips, automatic reclosing is prevented.

As shown in block 545, the FLISR unit 135 sends open commands to the R13 downstream isolation device 305 for the parallel phases (i.e., the phases in the second subset), as illustrated in FIG. 4F. For example, the A phase for the R13 isolation device 305 is fed by both the source S2 and the source S3. Opening the non-faulted phase removes this parallel source condition. In some embodiments, when there are multiple non-faulted phases in the second subset, the FLISR unit 135 opens the non-faulted phases on the R13 downstream isolation device 305 individually using sequential open commands. In some embodiments, after completing the tie-in processing (block 545) without any trips, the FLISR unit 135 sends mode messages to the R15, R14, R13, R12, R8, R10, and R11 isolation devices 305 on the path to both sources S2, S3 placing them back in reclose mode.

As shown in block 550, the FLISR unit 135 sends fault state reset commands to the R5, R14, and R13 isolation devices 305 to reset the fault states and allow fault monitoring to be processed using the re-configured the power distribution network 105.

Figure 6B:
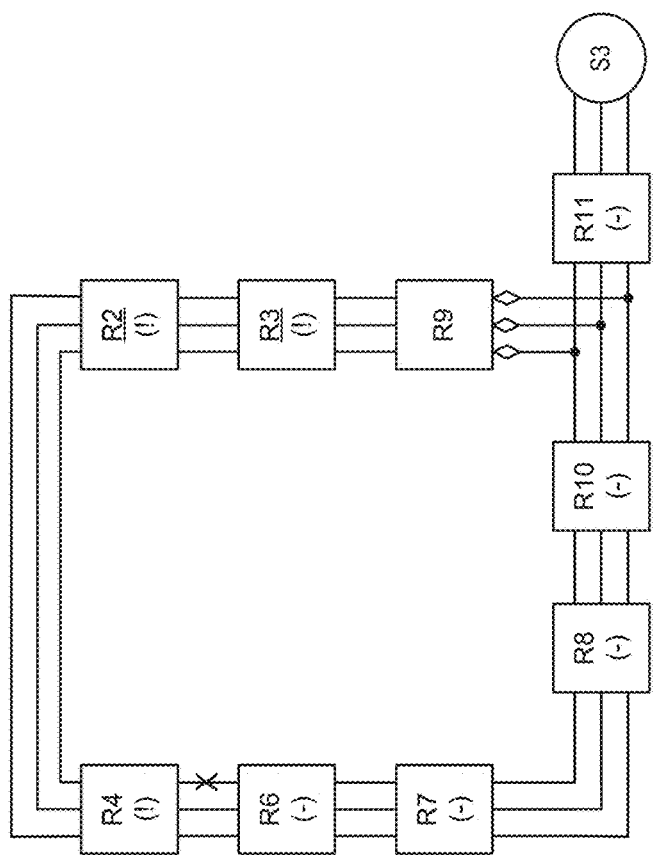
FIGS. 6A-6E are diagrams illustrating the operation of the system of FIG. 1 for a loss of voltage fault, according to some embodiments.
Figure 6A:
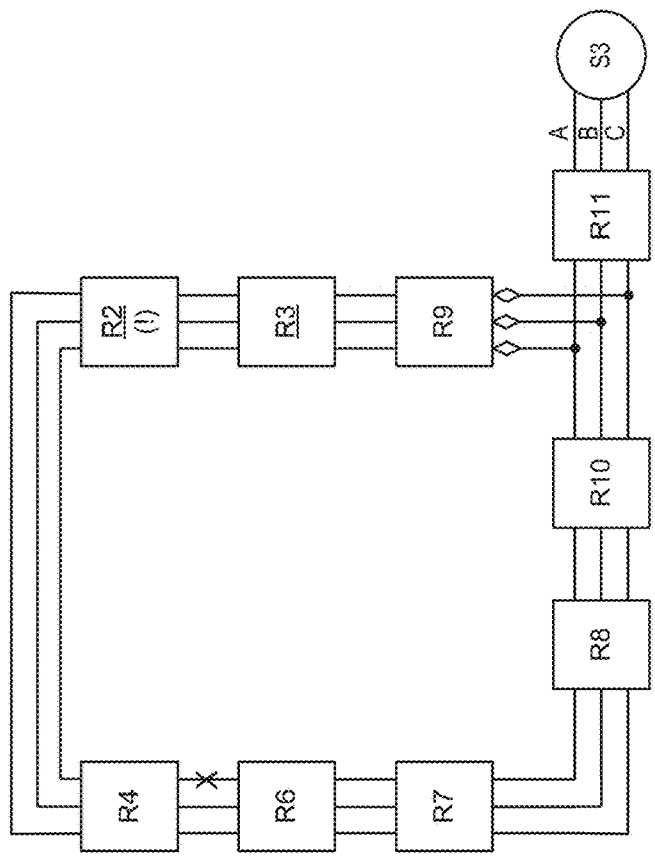
Figure 6D:
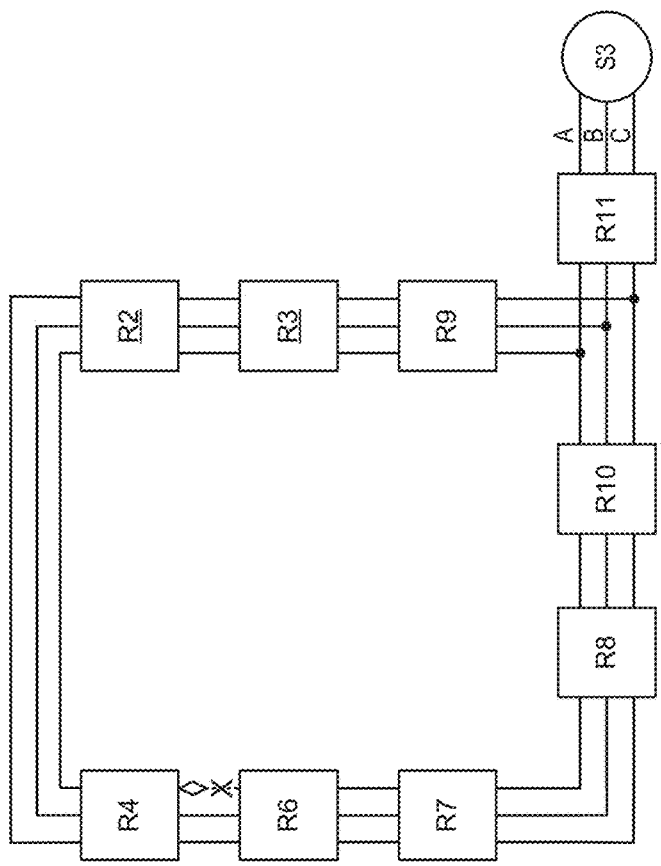
Figure 6C:
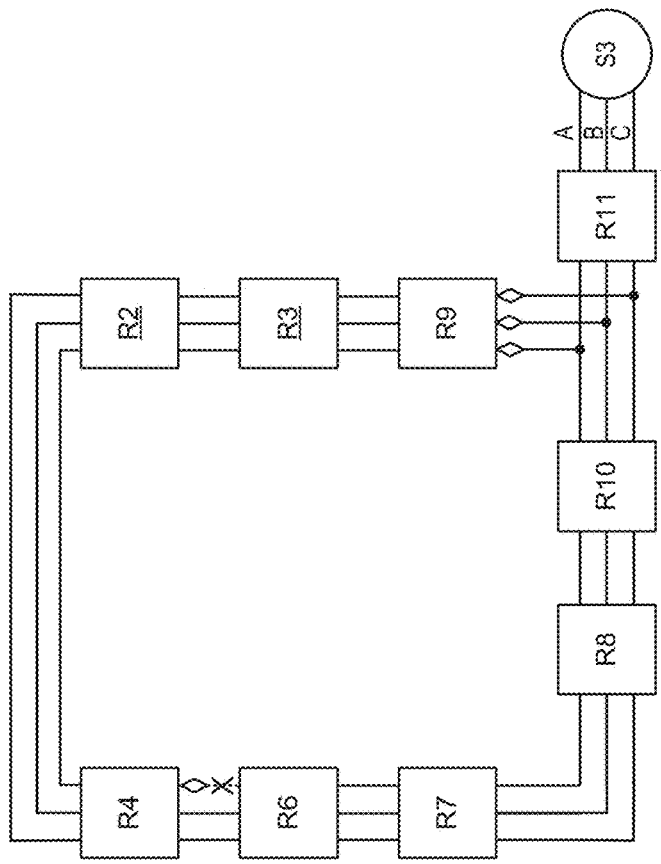
Figure 6E:
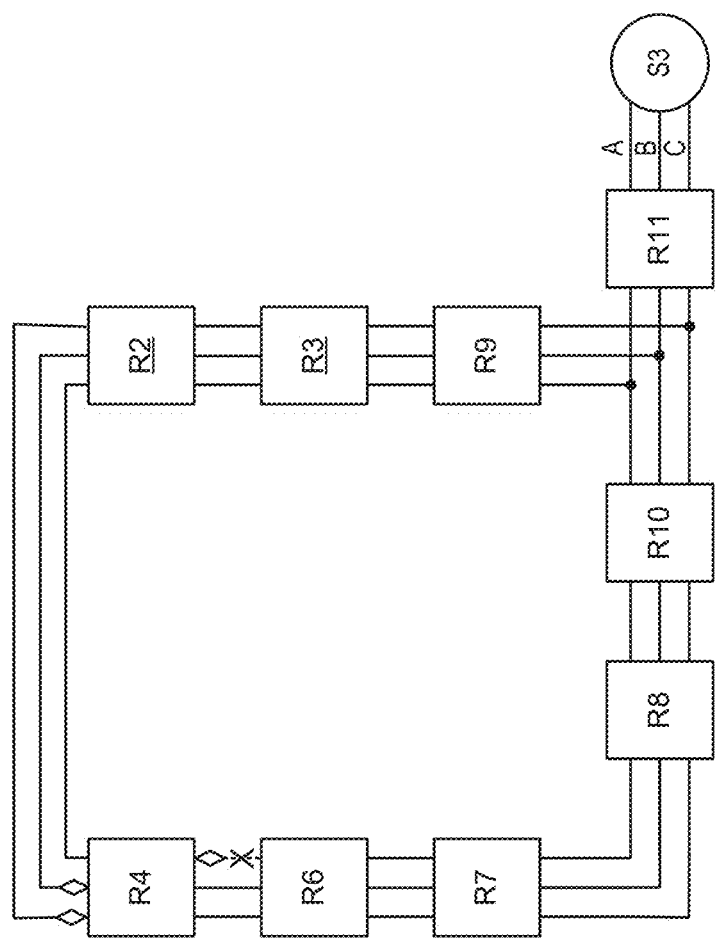
Figure 7:
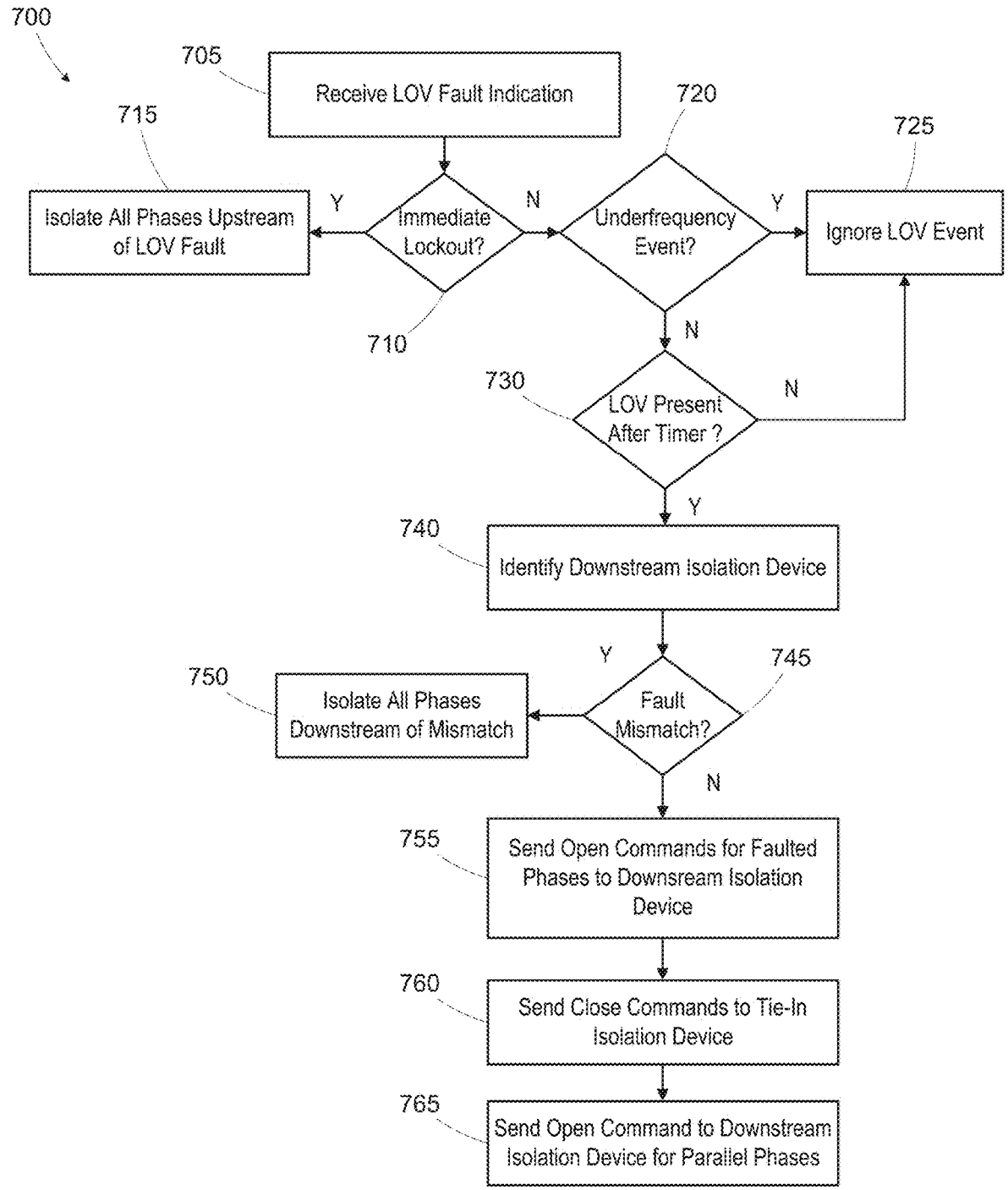
FIG. 7 is a flowchart of a method for operating the system of FIG. 1 for a loss of voltage fault, according to some embodiments.

Referring to FIGS. 6A-6E and FIG. 7, the operation of the system of FIG. 1 is illustrated for a loss of voltage (LOV) fault. FIGS. 6A-6E are diagrams illustrating the operation of the system of FIG. 1 for an LOV fault in a portion of the power distribution network 105 of FIG. 2, according to some embodiments. FIG. 7 is a flowchart of a method 700 for operating of the system of FIG. 1 for an LOV fault, according to some embodiments.

In some embodiments, an LOV fault is detected by one or more of the isolation devices 305, but does not cause an automatic lockout or trip of the identifying isolation device 305. An LOV fault is defined as an event where the measured voltage on at least one phase drops below a predefined threshold level. In some embodiments, the predefined threshold level (e.g., 5-95%) is a user-specified parameter.

Referring to FIG. 7, an LOV fault indication is received as shown in block 705, for example, from the R2 isolation device 305 (i.e., as indicated by the "!" in the R2 block). In some instances, the isolation device 305 that identifies the LOV fault is not the isolation device 305 closest to the fault. For example, the communication links between the isolation devices 305 and the FLISR unit 135 may have different latencies. For purposes of the following example, assume that the LOV fault is present due to a fault between the R4 isolation device 305 and the R6 isolation device 305 on the A phase, and the R2 isolation device 305 identifies the LOV fault responsive to the voltage dropping below the predefined threshold. FIG. 6A illustrates the power distribution network 105 prior to any automatic operations, with the fault illustrated on the A phase between the R4 and R6 isolation devices 305. The FLISR unit 135 identifies a first subset of the phases that includes the faulted phase, A, and a second subset of the phases that includes the non-faulted phases, B and C.

As shown in block 710, the FLISR unit 135 determines if the LOV fault is associated with an immediate lockout condition. In some embodiments, immediate lockout conditions include the LOV fault occurring at a transformer or at a substation, indicating an equipment failure. If an immediate lockout condition is identified (block 710), the FLISR unit 135 initiates a lockout of all phases of the isolation devices 305 closest to the LOV fault as shown in block 715.

As shown in block 720, the FLISR unit 135 determines if the LOV fault is associated with a concurrent underfrequency event. If a concurrent underfrequency event is identified, the FLISR unit 135 ignores the LOV event as shown in block 725.

In some embodiments, the FLISR unit 135 waits for a predetermined time interval (e.g., 30 seconds) after receiving the lockout fault indication before proceeding with restoration operations. As shown in block 730, the FLISR unit 135 determines if the LOV fault is still present after the predetermined time interval. The FLISR unit 135 may evaluate the currently reported fault states or send a refresh command to the isolation devices 305 to evaluate the status of the LOV fault upon expiration of the timer (block 730). If the LOV fault clears (block 730), the FLISR unit 135 ignores the LOV fault as shown in block 725. If the LOV fault is still present (block 730), the FLISR unit 135 attempts to identify the fault location by examining the fault states of other isolation devices 305 starting from the source S3 and working toward the LOV fault issuing R2 isolation device 305.

As shown in block 740, the FLISR unit 135 identifies a downstream isolation device 305 representing the isolation device 305 immediately downstream of the LOV fault. The FLISR unit 135 starts at the source S3, and evaluates the fault states of the R11, R10, R8, R7, R6, and R4 isolation devices 305. Isolation devices 305 with asserted faults states are identified with "!" indicators, and isolation devices 305 with clear fault states are identified with "–" indicators in FIG. 6B. In the example of FIG. 6B, the R6 isolation device 305 is the last isolation device 305 with a clear fault state, and the R4 isolation device 305 is the downstream isolation device 305, as it is the first with an asserted LOV fault state. In general, the isolation devices 305 downstream of the fault, e.g., the R4, R2, and R3 isolation devices 305, should have the same asserted LOV fault states, and the R6 isolation device 305 immediately upstream of the fault should have a LOV fault state that is clear since the fault does not affect the transmission lines associated with the R6 isolation device 305. The FLISR unit 135 identifies the isolation device 305 downstream of the R6 isolation device 305 with an asserted LOV fault state as the downstream isolation device 305 (i.e., the R4 isolation device 305) (block 740).

As shown in block 745, the FLISR unit 135 identifies a fault mismatch. A fault mismatch is registered in response to the R4 isolation device 305 having a fault state that registers a different LOV fault condition than the fault state of the R2 triggering isolation device 305. For example, a mismatch may be identified in an example where the R4 isolation device 305 registers an LOV affecting phase A, and the R2 triggering isolation devices 305 registers an LOV fault with a different phase. Although block 745 is illustrated as being performed after block 740, the mismatch condition is actually identified concurrently with the identification of the downstream isolation device 305 (block 740). If a fault mismatch is identified (block 745), the FLISR unit 135 opens all phases of the isolation device 305 with the fault mismatch as shown in block 750. If a fault mismatch is not identified (block 745), the FLISR unit 135 proceeds with single phase isolation and restoration operations.

As shown in block 755, the FLISR unit 135 sends open commands for the phases in the first subset affected by the LOV fault (i.e., the A phase) to the R4 downstream isolation device 305, as illustrated in FIG. 6C. Open transmission lines 200 are illustrated with dashed lines, where an open diamond is adjacent the isolation device 305 isolating the transmission line 200 from a power source.

As shown in block 760, the FLISR unit 135 sends close commands for a tie-in isolation device 305, as illustrated in FIG. 6D. For example, the R9 isolation device 305 is downstream of the fault and the R4 downstream isolation device 305 and can provide an alternate path for power from the source S3. In some embodiments, the FLISR unit 135 sends a ganged close command to the R9 tie-in device 305. In some embodiments, the FLISR unit 135 sends mode messages to the R10, R8, R6, R7, R11, R9, R3, R2, and R4 isolation devices 305 on the paralleled phase placing them in one shot mode prior to sending the close commands. Thus, if one of the isolation devices 305 on the paralleled phases trips, automatic reclosing is prevented.

As shown in block 765, the FLISR unit 135 sends open commands to the R4 downstream isolation device 305 for the parallel phases, as illustrated in FIG. 6E. For example, the non-faulted phases in the second subset (i.e., the B and C phases) for the R4 isolation device 305 are fed by the source S3 from both sides. Opening the non-faulted phase(s) removes this parallel source condition. In some embodiments, when there are multiple non-faulted phases, the FLISR unit 135 opens the non-faulted phases on the R4 downstream isolation device 305 individually using sequential open commands. In some embodiments, after completing the tie-in processing (block 765) without any trips, the FLISR unit 135 sends mode messages to the R7, R6, R4, R3, R2, R8, R10, and R11 isolation devices 305 placing them back in reclose mode.

The techniques described herein isolate faults and restore power using an individual phase approach. This approach increases system utilization by reducing the number of customers experiencing power outages as a result from a fault condition, thereby increasing customer satisfaction and preserving revenue generated by the non-affected phases.

The following examples illustrate example systems and methods described herein.

Example 1: a system for controlling a power distribution network providing power using a plurality of phases, the system comprising: an electronic processor; and memory storing instructions that, when executed by the electronic processor, cause the system to: receive a first fault indication associated with a fault in the power distribution network from a first isolation device of a plurality of isolation devices; identify a first subset of the plurality of phases associated with the first fault indication and a second subset of the plurality of phases not associated with the first fault indication, wherein the first subset and the second subset each include at least one member; identify an upstream isolation device upstream of the fault; identify a downstream isolation device downstream of the fault; send an open command to the downstream isolation device for each phase in the first subset; and responsive to the first isolation device not being the upstream isolation device, send a close command to the first isolation device for each phase in the first subset.

Example 2: the system of example 1, wherein the memory stores instructions that, when executed by the electronic processor, cause the system to: responsive to the first isolation device not being the upstream isolation device, sending an open command to the upstream isolation device for each phase in the first subset.

Example 3. the system of example 1, wherein the memory stores instructions that, when executed by the electronic processor, cause the system to identify the upstream isolation device by: receiving fault states of the plurality of isolation devices; and designating a first selected isolation device positioned furthest downstream of a first source in the power distribution network having a fault state consistent with the first fault indication as the upstream isolation device.

Example 4: the system of example 3, wherein the memory stores instructions that, when executed by the electronic processor, cause the system to identify the downstream isolation device by designating a second selected isolation device positioned downstream of the upstream isolation device having a fault state that does not indicate the first fault indication as the downstream isolation device.

Example 5: the system of example 3, wherein the memory stores instructions that, when executed by the electronic processor, cause the system to: identify a second selected isolation device downstream of the first isolation device and upstream of the downstream isolation device having a fault state indicating a second fault indication different than the first fault indication; and send an open command to the second selected isolation device for each of the plurality of phases.

Example 6: the system of example 3, wherein the memory stores instructions that, when executed by the electronic processor, cause the system to: receive refreshed fault states of the plurality of isolation devices after receiving the first fault indication, wherein identifying the downstream isolation device and the upstream isolation device comprises identifying the downstream isolation device and the upstream isolation device using the refreshed fault states.

Example 7: the system of example 1, wherein the memory stores instructions that, when executed by the electronic processor, cause the system to: send a close command to the tie-in isolation device for each of the plurality of phases; and send an open command to the downstream isolation device for each phase in the second subset.

Example 8: the system of example 7, wherein the memory stores instructions that, when executed by the electronic processor, cause the system to send the close command to the tie-in isolation device by sending a ganged close command to concurrently close all of the phases of the tie-in isolation device.

Example 9: the system of example 8, wherein the memory stores instructions that, when executed by the electronic processor, cause the system to: send fault state reset commands to the plurality of isolation devices having asserted fault states after sending the open command to the tie-in isolation device.

Example 10 The system of example 7, wherein the memory stores instructions that, when executed by the electronic processor, cause the system to: send configuration commands to the tie-in isolation device, the upstream isolation device, and the downstream isolation device to disable a reclosing mode of the tie-in isolation device, the upstream isolation device, and the downstream isolation device prior to sending the close command to the tie-in isolation device; and send configuration commands to the tie-in isolation device, the upstream isolation device, and the downstream isolation device to enable the reclosing mode of the tie-in isolation device, the upstream isolation device, and the downstream isolation device after sending the open command to the tie-in isolation device.

Example 11: a method for controlling a power distribution network providing power using a plurality of phases, comprising: receiving, by an electronic processor, a first fault indication associated with a fault in the power distribution network from a first isolation device of a plurality of isolation devices; identifying, by the electronic processor, a first subset of the plurality of phases associated with the first fault indication and a second subset of the plurality of phases not associated with the first fault indication, wherein the first subset and the second subset each include at least one member; identifying, by the electronic processor, an upstream isolation device upstream of the fault; identifying, by the electronic processor, a downstream isolation device downstream of the fault; sending an open command, by the electronic processor, to the downstream isolation device for each phase in the first subset; and responsive to the first isolation device not being the upstream isolation device, sending a close command, by the electronic processor, to the first isolation device for each phase in the first subset.

Example 12: the method of example 11, comprising: responsive to the first isolation device not being the upstream isolation device, sending, by the electronic processor, an open command to the upstream isolation device for each phase in the first subset.

Example 13: the method of example 11, wherein identifying, by the electronic processor, the upstream isolation device comprises: receiving, by the electronic processor, fault states of the plurality of isolation devices; and designating, by the electronic processor, a first selected isolation device positioned furthest downstream of a first source in the power distribution network having a fault state consistent with the first fault indication as the upstream isolation device.

Example 14: the method of example 13, wherein identifying, by the electronic processor, the downstream isolation device comprises designating, by the electronic processor, a second selected isolation device positioned downstream of the upstream isolation device having a fault state that does not indicate the first fault indication as the downstream isolation device.

Example 15: the method of example 13, comprising: identifying, by the electronic processor, a second selected isolation device downstream of the first isolation device and upstream of the downstream isolation device having a fault state indicating a second fault indication different than the first fault indication; and sending an open command, by the electronic processor, to the second selected isolation device for each of the plurality of phases.

Example 16: the method of example 13, comprising: receiving, by the electronic processor, refreshed fault states of the plurality of isolation devices after receiving the first fault indication, wherein identifying, by the electronic processor, the downstream isolation device and the upstream isolation device comprises identifying, by the electronic processor, the downstream isolation device and the upstream isolation device using the refreshed fault states.

Example 17: the method of example 11, comprising: sending a close command, by the electronic processor, to the tie-in isolation device for each of the plurality of phases, and the method comprises: and sending an open command, by the electronic processor, to the tie-in isolation device for each phase in the second subset.

Example 18: the method of example 17, wherein sending the close command, by the electronic processor, to the tie-in isolation device comprises sending a ganged close command to concurrently close all of the phases of the tie-in isolation device.

Example 19: the method of example 17, comprising: sending fault state reset commands, by the electronic processor, to the plurality of isolation devices having asserted fault states after sending the open command to the tie-in isolation device.

Example 20: the method of example 17, comprising: sending configuration commands, by the electronic processor, to the tie-in isolation device, the upstream isolation device, and the downstream isolation device to disable a reclosing mode of the tie-in isolation device, the upstream isolation device, and the downstream isolation device prior to sending the close command to the tie-in isolation device; and sending configuration commands, by the electronic processor, to the tie-in isolation device, the upstream isolation device, and the downstream isolation device to enable the reclosing mode of the tie-in isolation device, the upstream isolation device, and the downstream isolation device after sending the open command to the tie-in isolation device.

EXAMPLES FOR SECOND CASE

Example 1: a system for controlling a power distribution network providing power using a plurality of phases, the system comprising: an electronic processor; and memory storing instructions that, when executed by the electronic processor, cause the system to: receive a loss of voltage fault indication associated with a fault in the power distribution network; identify a first subset of the plurality of phases associated with the loss of voltage fault indication and a second subset of the plurality of phases not associated with the loss of voltage fault indication, wherein the first and second subsets each include at least one member; identify a downstream isolation device downstream of the fault; send an open command to the downstream isolation device for each phase in the first subset; and send a close command to a tie-in isolation device downstream of the downstream isolation device.

Example 2: the system of example 1, wherein the memory stores instructions that, when executed by the electronic processor, cause the system to identify the downstream isolation device by: receiving fault states of the plurality of isolation devices; identifying a first isolation device positioned furthest from a power source having a fault state that does not indicate the loss of voltage fault indication as an upstream isolation device; and designating a second isolation device positioned downstream of the upstream isolation device and having a fault state that indicates the loss of voltage fault indication as the downstream isolation device.

Example 3: the system of example 2, wherein the memory stores instructions that, when executed by the electronic processor, cause the system to: identify a third isolation device downstream of the downstream isolation device having a fault state indicating a second fault condition different than the loss of voltage fault indication; and send an open command to the downstream isolation device for each of the plurality of phases.

Example 4: the system of example 1, wherein the memory stores instructions that, when executed by the electronic processor, cause the system to: receive fault states of the plurality of isolation devices; and ignore the loss of voltage fault indication responsive to the fault states indicating an absence of the loss of voltage fault indication after a predetermined time interval after receiving the loss of voltage fault indication.

Example 5: the system of example 4, wherein the memory stores instructions that, when executed by the electronic processor, cause the system to: receive refreshed fault states after the predetermined time interval, wherein identifying the downstream isolation device comprises identifying the downstream isolation device using the refreshed fault states.

Example 6: the system of example 1, wherein the memory stores instructions that, when executed by the electronic processor, cause the system to: receive fault states of the plurality of isolation devices; identify an underfrequency event occurring coincident with the loss of voltage fault indication based on the fault states; and ignore the loss of voltage fault indication responsive to identifying the underfrequency event.

Example 7: the system of example 1, wherein the memory stores instructions that, when executed by the electronic processor, cause the system to send the close command to the tie-in isolation device by sending a close command to the tie-in isolation device for each of the plurality of phases, and to send an open command to the downstream isolation device for each phase in the second subset.

Example 8: the system of example 7, wherein the memory stores instructions that, when executed by the electronic processor, cause the system to send the close command to the tie-in isolation device by sending a ganged close command to concurrently close all of the phases of the tie-in isolation device.

Example 9: the system of example 7, wherein the memory stores instructions that, when executed by the electronic processor, cause the system to send sequential open commands to the downstream isolation device for each phase in the second subset.

Example 10: the system of example 7, wherein the memory stores instructions that, when executed by the electronic processor, cause the system to: send configuration commands to the tie-in isolation device and the downstream isolation device to disable a reclosing mode of the tie-in isolation device and the downstream isolation device prior to sending the close command to the tie-in isolation device; and send configuration commands to the tie-in isolation device and the downstream isolation device to enable the reclosing mode of the tie-in isolation device and the downstream isolation device after sending the open command to the tie-in isolation device.

Example 11: a method for controlling a power distribution network providing power using a plurality of phases, comprising: receiving, by an electronic processor, a loss of voltage fault indication associated with a fault in the power distribution network; identifying, by the electronic processor, a first subset of the plurality of phases associated with the loss of voltage fault indication and a second subset of the plurality of phases not associated with the loss of voltage fault indication, wherein the first and second subsets each include at least one member; identifying, by the electronic processor, a downstream isolation device downstream of the fault; sending an open command, by the electronic processor, to the downstream isolation device for each phase in the first subset; and sending a close command, by the electronic processor, to a tie-in isolation device downstream of the downstream isolation device.

Example 12: the method of example 11, wherein identifying, by the electronic processor, the downstream isolation device comprises: receiving, by the electronic processor, fault states of the plurality of isolation devices; identifying a first isolation device positioned furthest from a power source having a fault state that does not indicate the loss of voltage fault indication as an upstream isolation device; and designating, by the electronic processor, a second isolation device positioned downstream of the upstream isolation device and having a fault state that indicates the loss of voltage fault indication as the downstream isolation device.

Example 13: the method of example 12, comprising: identifying, by the electronic processor, a third isolation device downstream of the downstream isolation device having a fault state indicating a second fault condition different than the loss of voltage fault indication; and sending an open command, by the electronic processor, to the downstream isolation device for each of the plurality of phases.

Example 14: the method of example 11, comprising: receiving, by the electronic processor, fault states of the plurality of isolation devices; and ignoring, by the electronic processor, the loss of voltage fault indication responsive to the fault states indicating an absence of the loss of voltage fault indication after a predetermined time interval after receiving the loss of voltage fault indication.

Example 15: the method of example 14, comprising: receiving, by the electronic processor, refreshed fault states after the predetermined time interval, wherein identifying the downstream isolation device, by the electronic processor, comprises identifying the downstream isolation device, by the electronic processor, using the refreshed fault states.

Example 16: the method of example 11, comprising: receiving, by the electronic processor, fault states of the plurality of isolation devices; identifying, by the electronic processor, an underfrequency event occurring coincident with the loss of voltage fault indication based on the fault states; and ignoring, by the electronic processor, the loss of voltage fault indication responsive to identifying the underfrequency event.

Example 17: the method of example 11, wherein sending, by the electronic processor, the close command to the tie-in isolation device comprises sending, by the electronic processor, a close command, by the electronic processor, to the tie-in isolation device for each of the plurality of phases, and the method comprises: sending an open command, by the electronic processor, to the tie-in isolation device for each phase in the second subset.

Example 18: the method of example 17, wherein sending the close command, by the electronic processor, to the tie-in isolation device comprises sending, by the electronic processor, a ganged close command to concurrently close all of the phases of the tie-in isolation device.

Example 19: the method of example 17, comprising: 18, comprising: sending, by the electronic processor, sequential open commands to the downstream isolation device for each phase in the second subset.

Example 20: the method of example 17, comprising: sending, by the electronic processor, configuration commands to the tie-in isolation device and the downstream isolation device to disable a reclosing mode of the tie-in isolation device and the downstream isolation device prior to sending the close command to the tie-in isolation device; and sending, by the electronic processor, configuration commands to the tie-in isolation device and the downstream isolation device to enable the reclosing mode of the tie-in isolation device and the downstream isolation device after sending the open command to the tie-in isolation device.

Various features and advantages of the embodiments described herein are set forth in the following claims.

What is claimed is:

1. A system for controlling a power distribution network providing power using a plurality of phases, the system comprising:
    an electronic processor; and
    memory storing instructions that, when executed by the electronic processor, cause the system to:
        receive a loss of voltage fault indication associated with a fault in the power distribution network;
        identify a first subset of the plurality of phases associated with the loss of voltage fault indication, wherein the first subset includes at least one of the plurality of phases;
        identify a second subset of the plurality of phases not associated with the loss of voltage fault indication, wherein the second subset includes at least one of the plurality of phases;
        identify a downstream isolation device downstream of the fault;
        send an open command to the downstream isolation device for each phase in the first subset; and
        send a close command to a tie-in isolation device downstream of the downstream isolation device.

2. The system of claim 1, wherein the memory stores instructions that, when executed by the electronic processor, cause the system to identify the downstream isolation device by:
    receiving fault states of the plurality of isolation devices;
    identifying a first isolation device positioned furthest from a power source having a fault state that does not indicate the loss of voltage fault indication as an upstream isolation device; and
    designating a second isolation device positioned downstream of the upstream isolation device and having a fault state that indicates the loss of voltage fault indication as the downstream isolation device.

3. The system of claim 2, wherein the memory stores instructions that, when executed by the electronic processor, cause the system to:
    identify a third isolation device downstream of the downstream isolation device having a fault state indicating a second fault condition different than the loss of voltage fault indication; and
    send an open command to the downstream isolation device for each of the plurality of phases.

4. The system of claim 1, wherein the memory stores instructions that, when executed by the electronic processor, cause the system to:
    receive fault states of the plurality of isolation devices; and
    ignore the loss of voltage fault indication responsive to the fault states indicating an absence of the loss of voltage fault indication after a predetermined time interval after receiving the loss of voltage fault indication.

5. The system of claim 4, wherein the memory stores instructions that, when executed by the electronic processor, cause the system to:
    receive refreshed fault states after the predetermined time interval, wherein identifying the downstream isolation device comprises identifying the downstream isolation device using the refreshed fault states.

6. The system of claim 1, wherein the memory stores instructions that, when executed by the electronic processor, cause the system to:
    receive fault states of the plurality of isolation devices;
    identify an underfrequency event occurring coincident with the loss of voltage fault indication based on the fault states; and
    ignore the loss of voltage fault indication responsive to identifying the underfrequency event.

7. The system of claim 1, wherein the memory stores instructions that, when executed by the electronic processor, cause the system to send the close command to the tie-in isolation device by sending a close command to the tie-in isolation device for each of the plurality of phases, and to send an open command to the downstream isolation device for each phase in the second subset.

8. The system of claim 7, wherein the memory stores instructions that, when executed by the electronic processor, cause the system to send the close command to the tie-in isolation device by sending a ganged close command to concurrently close all of the phases of the tie-in isolation device.

9. The method of claim 8, wherein the memory stores instructions that, when executed by the electronic processor, cause the system to send sequential open commands to the downstream isolation device for each phase in the second subset.

10. The system of claim 7, wherein the memory stores instructions that, when executed by the electronic processor, cause the system to:
    send configuration commands to the tie-in isolation device and the downstream isolation device to disable a reclosing mode of the tie-in isolation device and the downstream isolation device prior to sending the close command to the tie-in isolation device; and
    send configuration commands to the tie-in isolation device and the downstream isolation device to enable the reclosing mode of the tie-in isolation device and the downstream isolation device after sending the open command to the tie-in isolation device.

11. A method for controlling a power distribution network providing power using a plurality of phases, comprising:
    receiving, by an electronic processor, a loss of voltage fault indication associated with a fault in the power distribution network;
    identifying, by the electronic processor, a first subset of the plurality of phases associated with the loss of voltage fault indication, wherein the first subset includes at least one of the plurality of phases;
    identifying, by the electronic processor, a second subset of the plurality of phases not associated with the loss of voltage fault indication, wherein the second subset includes at least one of the plurality of phases;
    identifying, by the electronic processor, a downstream isolation device downstream of the fault;

sending an open command, by the electronic processor, to the downstream isolation device for each phase in the first subset; and sending a close command, by the electronic processor, to a tie-in isolation device downstream of the downstream isolation device.

12. The method of claim 11, wherein identifying, by the electronic processor, the downstream isolation device comprises:

receiving, by the electronic processor, fault states of the plurality of isolation devices;

identifying a first isolation device positioned furthest from a power source having a fault state that does not indicate the loss of voltage fault indication as an upstream isolation device; and designating, by the electronic processor, a second isolation device positioned downstream of the upstream isolation device and having a fault state that indicates the loss of voltage fault indication as the downstream isolation device.

13. The method of claim 12, comprising:

identifying, by the electronic processor, a third isolation device downstream of the downstream isolation device having a fault state indicating a second fault condition different than the loss of voltage fault indication; and sending an open command, by the electronic processor, to the downstream isolation device for each of the plurality of phases.

14. The method of claim 11, comprising:

receiving, by the electronic processor, fault states of the plurality of isolation devices; and ignoring, by the electronic processor, the loss of voltage fault indication responsive to the fault states indicating an absence of the loss of voltage fault indication after a predetermined time interval after receiving the loss of voltage fault indication.

15. The method of claim 14, comprising:

receiving, by the electronic processor, refreshed fault states after the predetermined time interval, wherein identifying the downstream isolation device, by the electronic processor, comprises identifying the downstream isolation device, by the electronic processor, using the refreshed fault states.

16. The method of claim 11, comprising:

receiving, by the electronic processor, fault states of the plurality of isolation devices;

identifying, by the electronic processor, an underfrequency event occurring coincident with the loss of voltage fault indication based on the fault states; and ignoring, by the electronic processor, the loss of voltage fault indication responsive to identifying the underfrequency event.

17. The method of claim 11, wherein sending, by the electronic processor, the close command to the tie-in isolation device comprises sending, by the electronic processor, a close command, by the electronic processor, to the tie-in isolation device for each of the plurality of phases, and the method comprises:

sending an open command, by the electronic processor, to the tie-in isolation device for each phase in the second subset.

18. The method of claim 17, wherein sending the close command, by the electronic processor, to the tie-in isolation device comprises sending, by the electronic processor, a ganged close command to concurrently close all of the phases of the tie-in isolation device.

19. The method of claim 18, comprising:

sending, by the electronic processor, sequential open commands to the downstream isolation device for each phase in the second subset.

20. The method of claim 17, comprising:

sending, by the electronic processor, configuration commands to the tie-in isolation device and the downstream isolation device to disable a reclosing mode of the tie-in isolation device and the downstream isolation device prior to sending the close command to the tie-in isolation device; and sending, by the electronic processor, configuration commands to the tie-in isolation device and the downstream isolation device to enable the reclosing mode of the tie-in isolation device and the downstream isolation device after sending the open command to the tie-in isolation device.

* * * * *